United States Patent
Sakamoto

(10) Patent No.: US 10,455,160 B2
(45) Date of Patent: Oct. 22, 2019

(54) DETECTING APPARATUS, DETECTING METHOD, COMPUTER-READABLE MEDIUM STORING A PROGRAM, LITHOGRAPHY APPARATUS, AND ARTICLE MANUFACTURING METHOD THAT CONTROL IMAGING DEVICE TO PERFORM IMAGING AT PARTICULAR TIME PERIOD

(71) Applicant: CANON KABUSHIKI KAISHA, Tokyo (JP)

(72) Inventor: Noritoshi Sakamoto, Shimotsuga-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 44 days.

(21) Appl. No.: 15/487,005

(22) Filed: Apr. 13, 2017

(65) Prior Publication Data
US 2017/0307985 A1    Oct. 26, 2017

(30) Foreign Application Priority Data

Apr. 20, 2016  (JP) .................................. 2016-084599

(51) Int. Cl.
G06T 7/20       (2017.01)
H04N 5/235      (2006.01)
G03F 9/00       (2006.01)

(52) U.S. Cl.
CPC ......... H04N 5/2353 (2013.01); G03F 9/7042 (2013.01); G03F 9/7088 (2013.01)

(58) Field of Classification Search
CPC ......... G03F 7/70483; G06T 7/20; G06T 7/70; G06T 7/001; G06T 2207/10004; G06T 2207/30148; G06T 2207/30204; H04N 5/2354; H04N 5/2353
USPC ........................................................... 348/87
See application file for complete search history.

(56) References Cited

U.S. PATENT DOCUMENTS

| 5,633,720 A | 5/1997 | Takahashi |
| 6,097,473 A * | 8/2000 | Ota ..................... G03F 9/7061 355/53 |
| 6,577,382 B2 * | 6/2003 | Kida ................... G03F 7/70691 355/77 |

(Continued)

FOREIGN PATENT DOCUMENTS

| CN | 101253452 A | 8/2008 |
| CN | 102531367 A | 7/2012 |

(Continued)

OTHER PUBLICATIONS

Office Action issued in Taiwanese Appln. No. 106111926 dated Mar. 23, 2018. English translation provided.

(Continued)

Primary Examiner — Shan E Elahi
(74) Attorney, Agent, or Firm — Rossi, Kimms & McDowell LLP

(57) ABSTRACT

A detecting apparatus that detects a mark includes: an imaging device configured to perform imaging of the mark; and a controller configured to control the imaging device. The controller is configured to control the imaging device such that only a period in which a position of an object with the mark is within a tolerance is a period of the imaging before the position converges within the tolerance.

16 Claims, 8 Drawing Sheets

(56) References Cited

U.S. PATENT DOCUMENTS

| | | | | |
|---|---|---|---|---|
| 6,693,700 B2* | 2/2004 | Shima | ................ | G03F 7/70358 |
| | | | | 355/53 |
| 6,699,627 B2* | 3/2004 | Smith | ................ | G03F 7/70558 |
| | | | | 430/22 |
| 6,699,628 B2* | 3/2004 | Shima | ................ | G03F 7/70358 |
| | | | | 430/22 |
| 6,985,209 B2* | 1/2006 | Yoshida | ................ | G03F 9/7003 |
| | | | | 355/53 |
| 7,245,349 B2* | 7/2007 | Sato | ................ | G03B 27/42 |
| | | | | 250/492.2 |
| 7,340,087 B2* | 3/2008 | Watkins | ................ | G01N 21/9503 |
| | | | | 250/559.36 |
| 8,772,734 B2* | 7/2014 | Yamanaka | ................ | H01J 37/09 |
| | | | | 250/396 R |
| 9,104,108 B2* | 8/2015 | Koya | ................ | G03F 7/20 |
| 9,261,802 B2 | 2/2016 | Mishima et al. | | |
| 9,665,016 B2* | 5/2017 | Shibazaki | ................ | G03F 7/70341 |
| 9,709,905 B2 | 7/2017 | Lin et al. | | |
| 2001/0026897 A1* | 10/2001 | Shima | ................ | G03F 7/70358 |
| | | | | 430/22 |
| 2002/0089655 A1* | 7/2002 | Kida | ................ | G03F 7/70691 |
| | | | | 355/72 |
| 2004/0090607 A1* | 5/2004 | Yoshida | ................ | G03F 9/7003 |
| | | | | 355/55 |
| 2006/0181242 A1* | 8/2006 | Freed | ................ | H02J 50/12 |
| | | | | 320/109 |
| 2007/0133864 A1* | 6/2007 | Morimoto | ................ | G03F 9/7003 |
| | | | | 382/151 |
| 2008/0203334 A1* | 8/2008 | Mitsui | ................ | G01V 8/20 |
| | | | | 250/559.36 |
| 2009/0126525 A1* | 5/2009 | Pietsch | ................ | G01B 5/0004 |
| | | | | 74/490.09 |
| 2010/0099049 A1* | 4/2010 | Owa | ................ | G03F 7/70291 |
| | | | | 430/322 |
| 2010/0182582 A1 | 7/2010 | Van De Kerkhof et al. | | |
| 2011/0294071 A1* | 12/2011 | Imaoka | ................ | H01J 1/02 |
| | | | | 430/296 |
| 2012/0057141 A1* | 3/2012 | Owa | ................ | G03F 7/70291 |
| | | | | 355/53 |
| 2014/0295355 A1* | 10/2014 | Koya | ................ | G03F 7/20 |
| | | | | 430/322 |
| 2015/0011026 A1* | 1/2015 | Oishi | ................ | H01L 22/20 |
| | | | | 438/14 |
| 2015/0022797 A1* | 1/2015 | Miyazaki | ................ | G03F 7/70616 |
| | | | | 355/67 |
| 2015/0277229 A1* | 10/2015 | Kimura | ................ | G03F 7/70716 |
| | | | | 355/67 |

FOREIGN PATENT DOCUMENTS

| | | |
|---|---|---|
| CN | 104375395 A | 2/2015 |
| JP | H08162393 A | 6/1996 |
| JP | H09289147 A | 11/1997 |
| TW | 201543543 A | 11/2015 |
| WO | 2013108868 A1 | 7/2013 |

OTHER PUBLICATIONS

Office Action issued in Chinese Appln. No. 201710247044.8 dated Aug. 15, 2019. English translation provided.

* cited by examiner

DETECTING APPARATUS, DETECTING METHOD, COMPUTER-READABLE MEDIUM STORING A PROGRAM, LITHOGRAPHY APPARATUS, AND ARTICLE MANUFACTURING METHOD THAT CONTROL IMAGING DEVICE TO PERFORM IMAGING AT PARTICULAR TIME PERIOD

BACKGROUND OF THE INVENTION

Field of the Invention

The present invention relates to a detecting apparatus, a detecting method, a program, a lithography apparatus, and an article manufacturing method.

Description of the Related Art

In lithography apparatuses used to manufacture semiconductor devices, it is necessary to position substrate with high precision. For example, the position of the substrate is decided by detecting apparatus included in the lithography apparatus based on detection results of the position of marks formed on the substrate. The substrate is held on stage and are moved to position at which the marks are detected by the stage. The stage immediately after arrival at the position is vibrating. Therefore, stabilization (stillness) of the vibration is awaited, and then the position of the substrate is detected. Accordingly, throughput of the lithography apparatus is restricted for standby times until the vibration is stabilized. In a technology disclosed in Japanese Patent Laid-Open No. H9-289147, a stabilization time after acceleration of a stage in a scanning exposure apparatus and before start of exposure is changed in accordance with a necessary resolution or the like.

However, even when the invention of Japanese Patent Laid-Open No. H9-289147 is applied to the foregoing detecting apparatus, it may be difficult to shorten a standby time depending on necessary detection precision.

SUMMARY OF THE INVENTION

The present invention provides, for example, a detecting apparatus advantageous in advancing completion of detection of a mark.

According to an aspect of the invention, a detecting apparatus that detects a mark includes: an imaging device configured to perform imaging of the mark; and a controller configured to control the imaging device. The controller is configured to control the imaging device such that only a period in which a position of an object with the mark is within a tolerance is a period of the imaging before the position converges within the tolerance.

Further features of the present invention will become apparent from the following description of exemplary embodiments with reference to the attached drawings.

DESCRIPTION OF THE EMBODIMENTS

Hereinafter, embodiments of the present invention will be described with reference to the drawings.

First Embodiment

Figure 1:
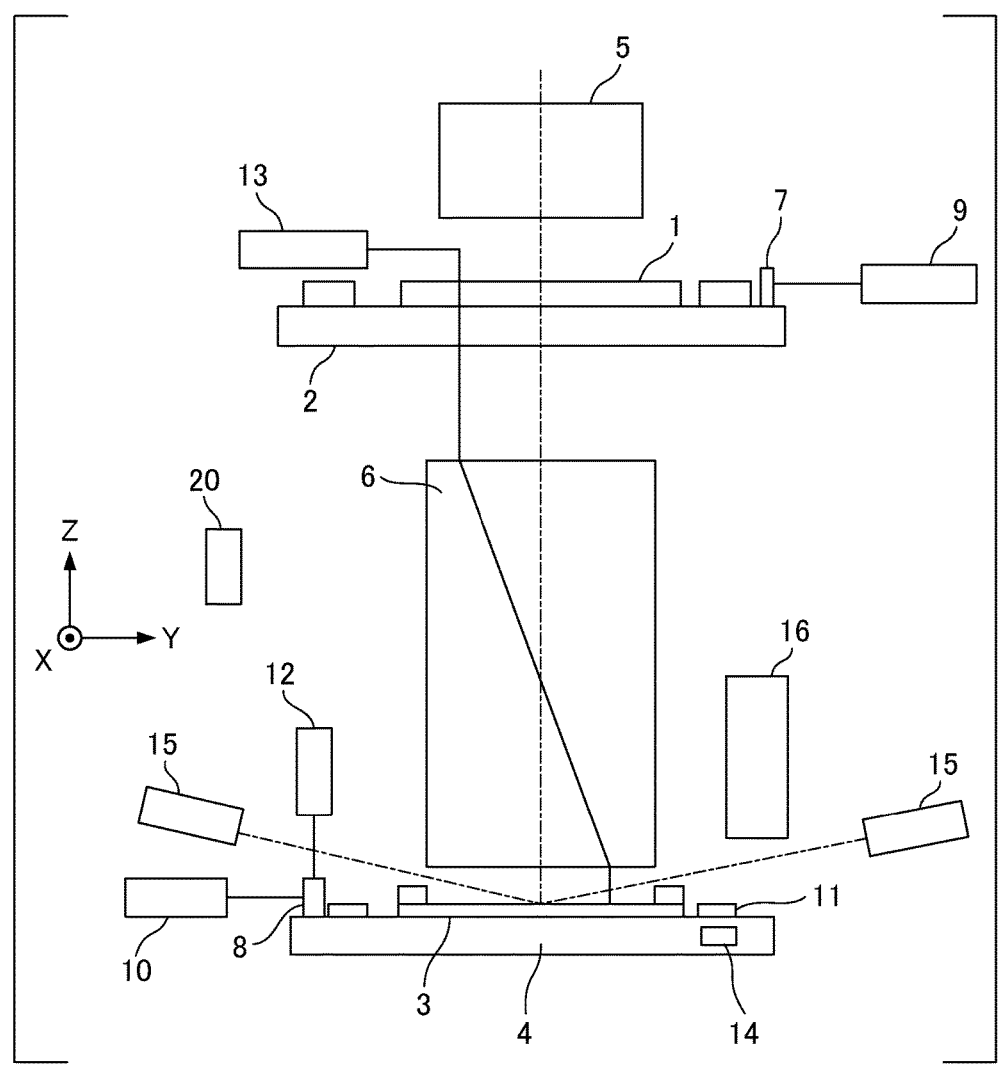
FIG. 1 is a schematic diagram illustrating a detecting apparatus and an exposure apparatus according to a first embodiment.

FIG. 1 is a schematic diagram illustrating a detecting apparatus and an exposure apparatus according to a first embodiment. The detecting apparatus can also be applied to another lithography apparatus (for example, an imprint apparatus). However, in the embodiment, application of the detecting apparatus to an exposure apparatus will be described as an example. The detecting apparatus according to the embodiment includes laser interferometers 9, 10, and 12, a reticle alignment detecting system 13 serving as an imaging device that performs imaging of a mark, a wafer alignment detecting system 16, and a focus and tilt detecting system 15. The exposure apparatus including the detecting apparatus according to the embodiment includes a reticle stage 2, a wafer stage (substrate holding unit) 4, an illumination optical system 5, and a projection optical system 6. The reticle stage 2 supports and positions the reticle (original plate) 1. The wafer stage 4 supports and positions a wafer (a substrate or a measurement object) 3. The illumination optical system 5 illuminates the reticle 1 with exposure light. The projection optical system 6 projects a pattern image of the reticle 1 illuminated with the exposure light on the wafer 3 supported by the wafer stage 4. A controller 20 can include a computer and a memory, generally control operations of the detecting apparatus and the exposure apparatus, and cause the computer to execute a detecting method according to the embodiment as a program. According to the embodiment, the controller 20 is assumed to be included in the detecting apparatus.

In the embodiment, a scanning exposure apparatus (scanning stepper) that projects a pattern formed on the reticle 1 on the wafer 3 to expose the pattern while mutually synchronizing and moving the reticle 1 and the wafer 3 in a scanning direction is used as the exposure apparatus. The exposure apparatus may be an exposure apparatus (stepper) that fixes the reticle 1 and projects the pattern of the reticle 1 on the wafer 3 to expose the pattern. A direction parallel to an optical axis of the projection optical system 6 is assumed to be a Z direction, a synchronization and movement direction (scanning direction) of the reticle 1 and the wafer 3 on a plane vertical to the optical axis is assumed to be a Y direction, and a direction (non-scanning direction) vertical to the Y direction in the plane is assumed to be an X direction. Directions around the axes of the X, Y, and Z axes which are axis extending in the directions are assumed to be $\theta_X$, $\theta_Y$, and $\theta_Z$ directions.

A predetermined illumination region on the reticle 1 is illuminated with exposure light with a uniform illuminance distribution by the illumination optical system 5. Light of a mercury lamp, a KrF excimer laser, an ArF excimer laser, an F2 laser, or extreme ultraviolet (EUV) light is used as the exposure light emitted from the illumination optical system 5.

The reticle stage 2 can be moved 2-dimensionally in a plane vertical to the optical axis of the projection optical system 6, that is, the XY plane, and can be minutely rotated in the $\theta_Z$ direction. In the embodiment, three driving axes are indicated, but any of one to six driving axes may be used. The reticle stage 2 is driven by a reticle stage driving device (not illustrated) such as a linear motor and the reticle stage driving device is controlled by the controller 20. A mirror 7 is installed on the reticle stage 2. The laser interferometer 9 included in the detecting apparatus is disposed at a position facing the mirror 7. The laser interferometer 9 measures the position and $\theta_Z$ of the reticle 1 in a 2-dimensional direction (XY direction) in real time and outputs a measurement result to the controller 20. The controller 20 positions the reticle 1 supported by the reticle stage 2 by driving the reticle stage driving device based on the measurement result.

The wafer stage 4 includes a $\theta Z$ tilt stage that holds the wafer 3 via a wafer chuck (not illustrated), an XY stage (not illustrated) that supports the $\theta Z$ tilt stage, and a base (not illustrated) that supports the XY stage. The wafer stage 4 is driven by the wafer stage driving device (not illustrated), which may be a linear motor. The wafer stage driving device is controlled by the controller 20. A mirror 8 is installed on the wafer stage 4. The laser interferometers 10 and 12 included in the detecting apparatus are disposed at positions at which they face the mirror 8. The laser interferometer 10 measures the position and $\theta_Z$ of the wafer 3 in the 2-dimensional direction (XY direction) in real time and outputs a measurement result to the controller 20. The laser interferometer 12 measures the position and $\theta_x$ and $\theta_y$ of the wafer 3 in the Z direction in real time and outputs a measurement result to the controller 20. The controller 20 positions the wafer 3 supported by the wafer stage 4 by driving the wafer stage driving device based on the measurement result.

The projection optical system 6 projects and exposes a reticle pattern of the reticle 1 on the wafer 3 at a predetermined projection magnification β and is configured to include a plurality of optical elements. In the embodiment, the projection optical system 6 is a reduction projection system in which the projection magnification β is, for example, ¼ or ⅕.

The reticle alignment detecting system 13 included in the detecting apparatus is disposed near the reticle stage 2 and detects (images) a reference mark (not illustrated) on the reticle 1 and reference marks 17 (see FIG. 2) formed on reference plates 11 on the wafer stage 4. The reference plates 11 are installed in corners of the wafer stage 4 so that the surfaces of the reference plates 11 and the surface of the wafer 3 have substantially the same height. The reference mark 17 is detected through the projection optical system 6. For example, a photoelectric conversion element such as a CMOS sensor is mounted on the reticle alignment detecting system 13. The reticle alignment detecting system 13 detects light reflected from the reference mark on the reticle 1 and the reference mark 17 and outputs a detection result (signal) to the controller 20. The controller 20 controls the wafer stage driving device and the reticle stage driving device based on the signal and aligns positions and focuses of the reference mark on the reticle 1 and the reference mark 17 to align relative positions (X, Y, Z) of the reticle 1 and the wafer 3.

The reference mark 17 may be a reflective mark or a transmissive mark. When the reference mark 17 is a transmissive mark, the reticle alignment detecting system 14 is used. A light amount sensor that detects transmitted light transmitted through the reference mark 17 is mounted on the reticle alignment detecting system 14. The amount of transmitted light can be measured while driving the wafer stage 4 in the X direction (or the Y direction) and the Z direction and the positions and focuses of the reference mark on the reticle 1 and the reference mark 17 can be aligned based on a measurement result. In this way, regardless of which of the reticle alignment detecting system 13 and the reticle alignment detecting system 14 is used, the relative positional relation (X, Y, Z) of the reticle 1 and the wafer 3 can be aligned.

Figure 2:
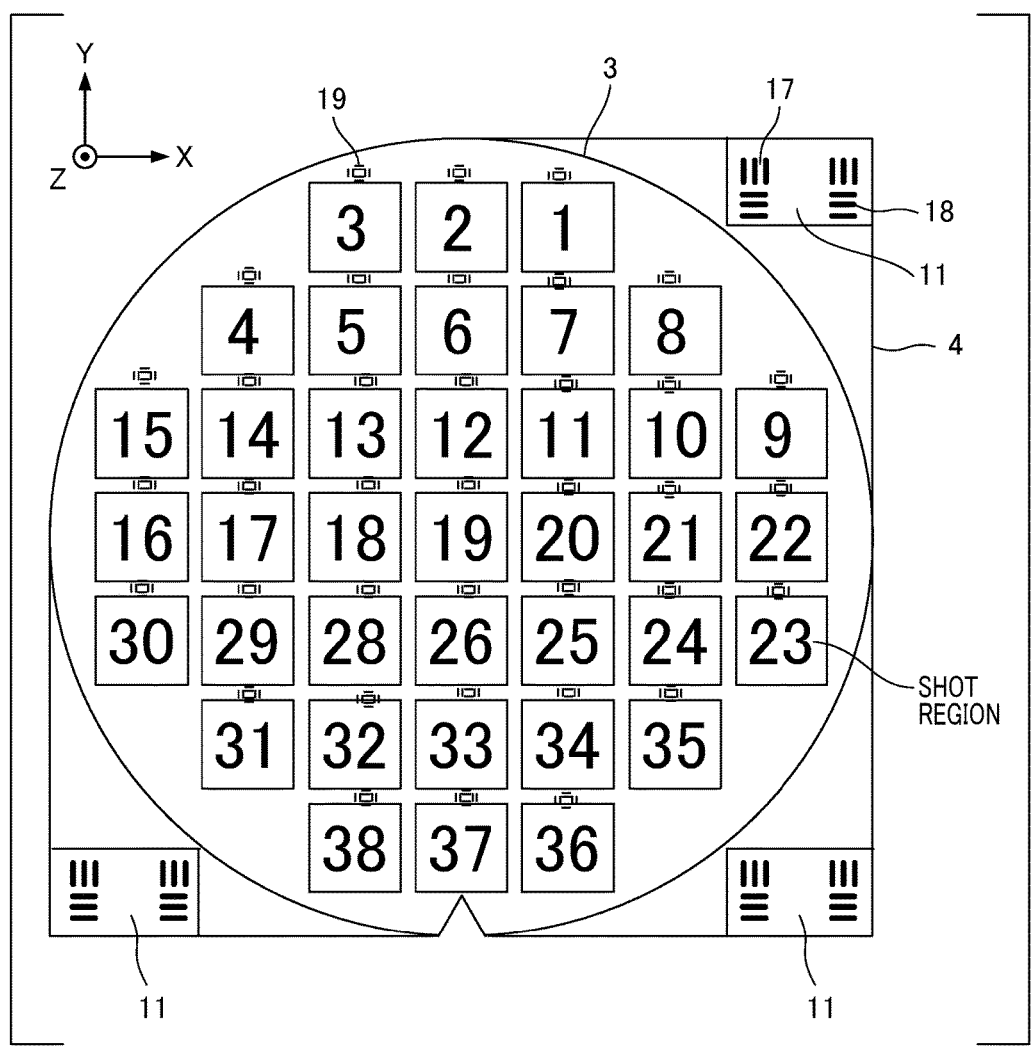
FIG. 2 is a diagram illustrating a wafer placed on a wafer stage when viewed in the +Z direction.

FIG. 2 is a diagram illustrating the wafer 3 placed on the wafer stage 4 when viewed in the +Z direction. In the wafer stages 4, the reference plates 11 are installed in corners. The reference plate 11 has the reference mark 17 and a reference mark 18 used for wafer alignment. A positional relation (XY direction) between the reference mark 17 for reticle alignment and the reference mark 18 for wafer alignment is assumed to be known. The reference marks 17 and 18 may be common marks. In the wafer 3, a layout of shot regions 1 to 38 is illustrated and an alignment mark 19 is formed near each shot region.

The wafer alignment detecting system 16 included in the detecting apparatus is an off-axis optical system that has an optical axis at a position distant from the optical axis of the projection optical system 6 and includes an irradiation system that irradiates the alignment marks 19 and the reference marks 18 on the reference plates 11 on the wafer 3 with detection light. Further, a light reception system that receives light reflected from these marks is included therein so that the alignment marks 19 and the reference marks 18 are imaged. The focus and tilt detecting system 15 includes an irradiation system that irradiates the surface of the wafer 3 with detection light and a light reception system that receives light reflected from the wafer 3.

Figure 3:
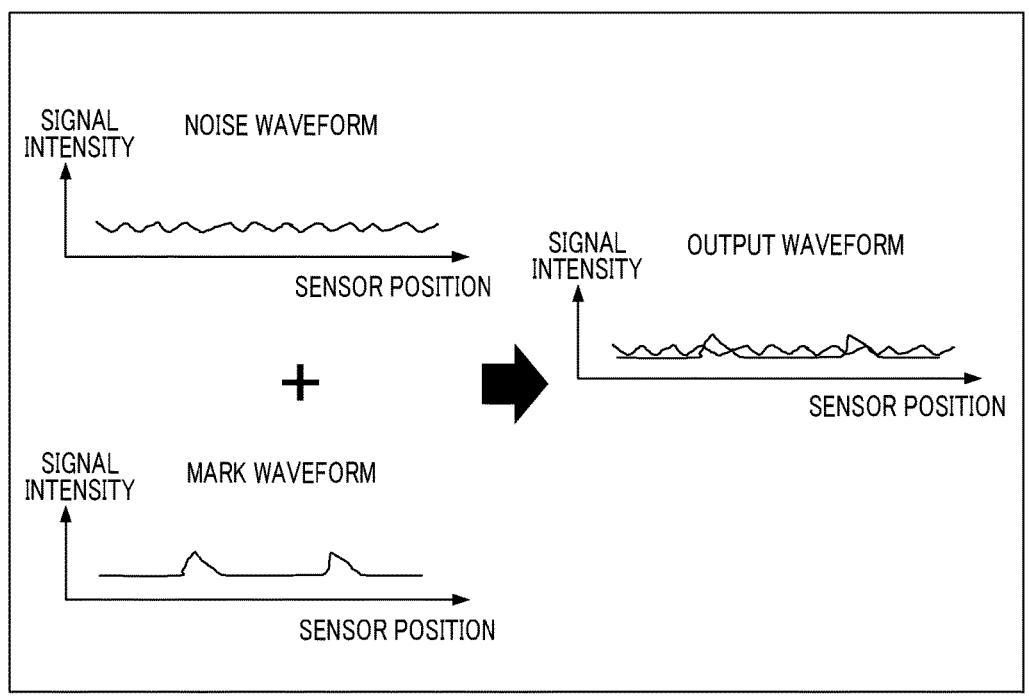
FIG. 3 is a diagram illustrating waveforms of signal intensities of light reflected from a mark.
Figure 4:
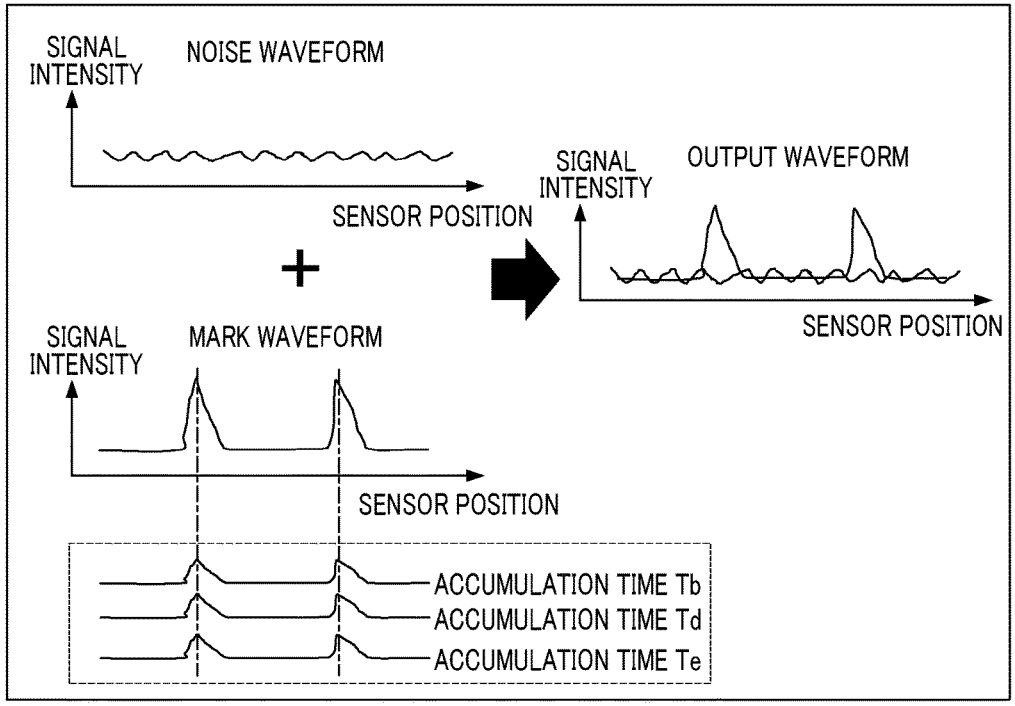
FIG. 4 is a diagram illustrating waveforms of signal intensities of light reflected from the mark.
Figure 5:
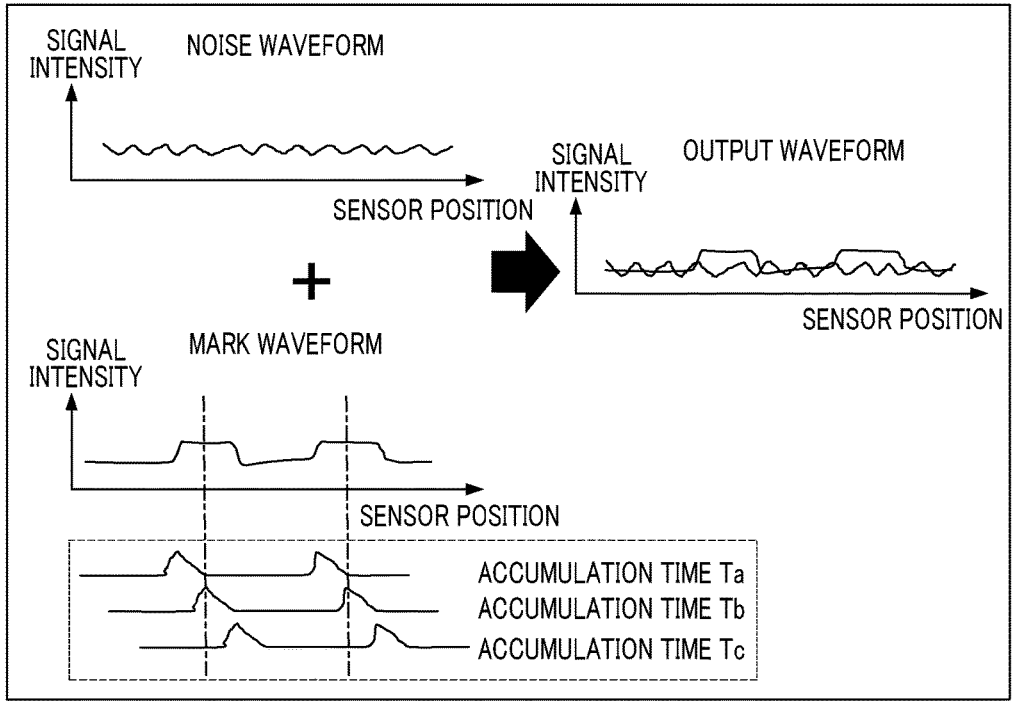
FIG. 5 is a diagram illustrating waveforms of signal intensities of light reflected from the mark.
Figure 6:
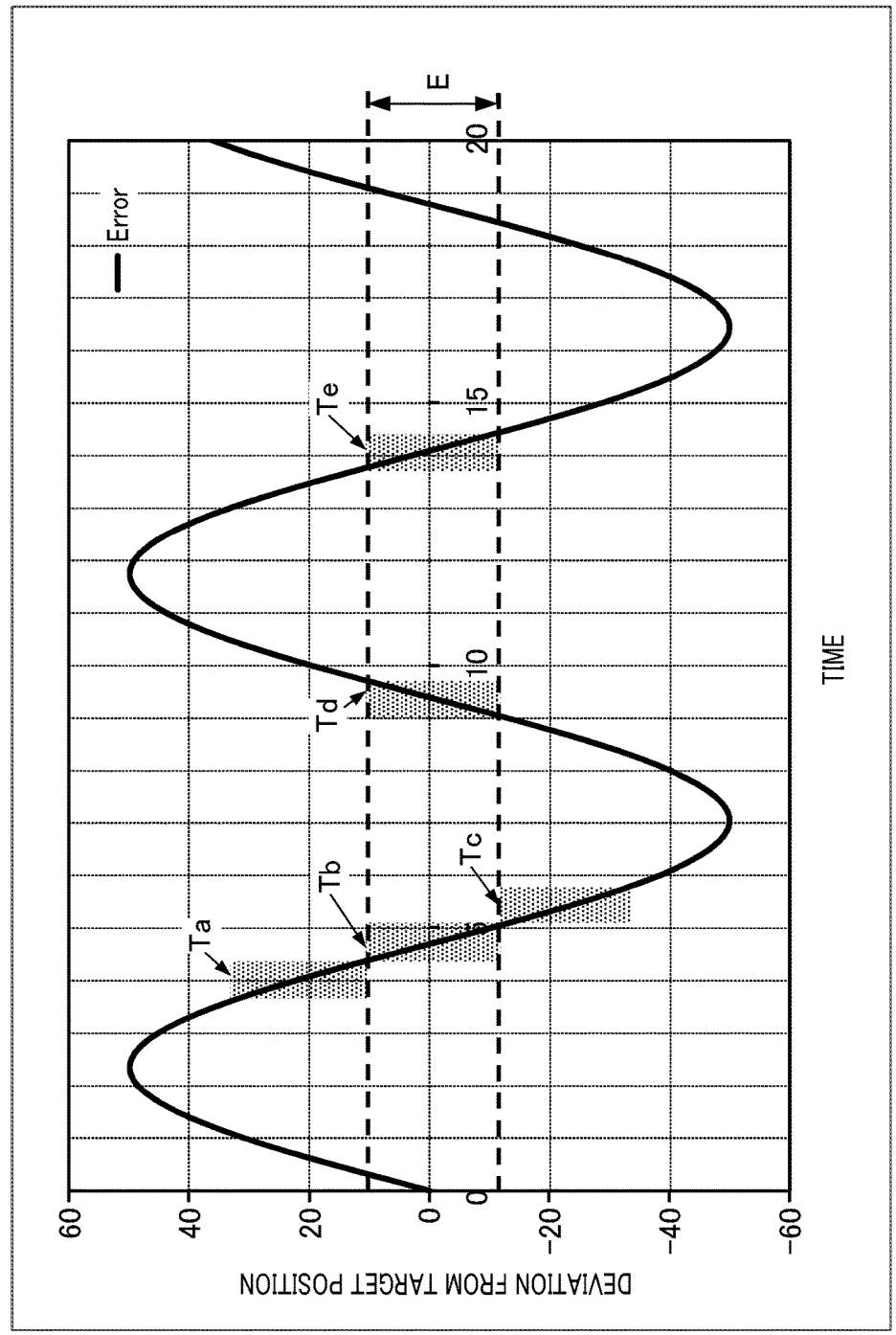
FIG. 6 is a diagram illustrating a relation between elapsed time from start of movement of a stage to a target position and a deviation of the position of the stage from the target position.

To detect (image) the marks, it is important to adjust an accumulation time (an imaging period) in which charges converted from the light reflected from the marks by the detecting system are accumulated. The accumulation time will be described with reference to FIGS. 3 to 6. FIGS. 3 to 5 are diagrams schematically illustrating waveforms of signal intensities of light reflected from the marks. FIG. 6 is a diagram illustrating a relation between elapsed time (the horizontal axis) from start of movement of a stage (which is a member in which the marks are formed) to a target position and a deviation (the vertical axis) of the position of the stage from the target position. In FIG. 6, Ta to Te indicated by shades represent accumulation times in which the charges converted from the light reflected from the marks by the detecting system are accumulated and which are the same as each other. E represents a tolerance of a deviation centering on a falling position of periodic vibration of the stage. This value is set in view of measurement precision or throughput. When the deviation is within the tolerance (when vibration of the stage is still), it is possible to measure the marks.

The waveforms illustrated in FIGS. 3 to 5 are waveforms in which the horizontal axis represents a position on a sensor included in the detecting system and the vertical axis represents a signal intensity measured by the sensor. A waveform output by the detecting system is a waveform obtained by combining a noise waveform and a mark waveform. In the following description, a case in which two marks of which X coordinates are different are measured for a predetermined accumulation time is considered. FIG. 3 illustrates a result obtained by measuring the mark for one of the accumulation times Ta to Te illustrated in FIG. 6. As illustrated in FIG. 3, since a peak of the signal intensity of the noise waveform is equal to a peak of the signal intensity of the mark waveform, the mark waveform is buried in the noise waveform in the output waveform obtained by combining the noise waveform and the mark waveform. In this case, it is difficult to determine the position of the mark.

FIG. 4 illustrates a result obtained by imaging the mark for the plurality of discontinuous accumulation times Tb, Td, and Te while the vibration of the stage is within the tolerance. In this case, as illustrated in the drawing, a signal intensity of the noise waveform is the same as the signal intensity in FIG. 3, but a signal intensity at a peak of the mark waveform is stronger. In an output waveform, the mark waveform is not buried in the noise waveform. An intensity at which the mark waveform is not buried in the noise waveform is set as a threshold. The peaks of the mark waveforms for accumulation times are at the same position on a sensor. Therefore, when the mark waveform for the accumulation time Tb, the mark waveform for the accumulation time Td, and the mark waveform for the accumulation time Te, are combined (integrated), the signal intensity is stronger when the peak exceeds the threshold.

FIG. 5 illustrates a result obtained by measuring the mark for the accumulation times Ta, Tb, and Tc. In this case, as illustrated in the drawing, in an output waveform, the mark waveform is buried in the noise waveform unlike FIG. 4. The accumulation times have the same length as the accumulation times in the case of FIG. 4, but the peaks of the mark waveforms are not at the same position on a sensor in each accumulation time. Therefore, even when the mark waveforms are combined, the signal intensity is no stronger when the peak is not buried in the noise waveform.

From the above description, it is possible to understand that it is important not only to lengthen the accumulation time but also to acquire the mark waveform measured while the vibration of the stage is within the tolerance in order to detect the positions of the marks. The foregoing deviation is calculated in real time based on outputs (signals) of the laser interferometers (measuring device) 10 and 12 measuring positional information of the stage.

Figure 7A:
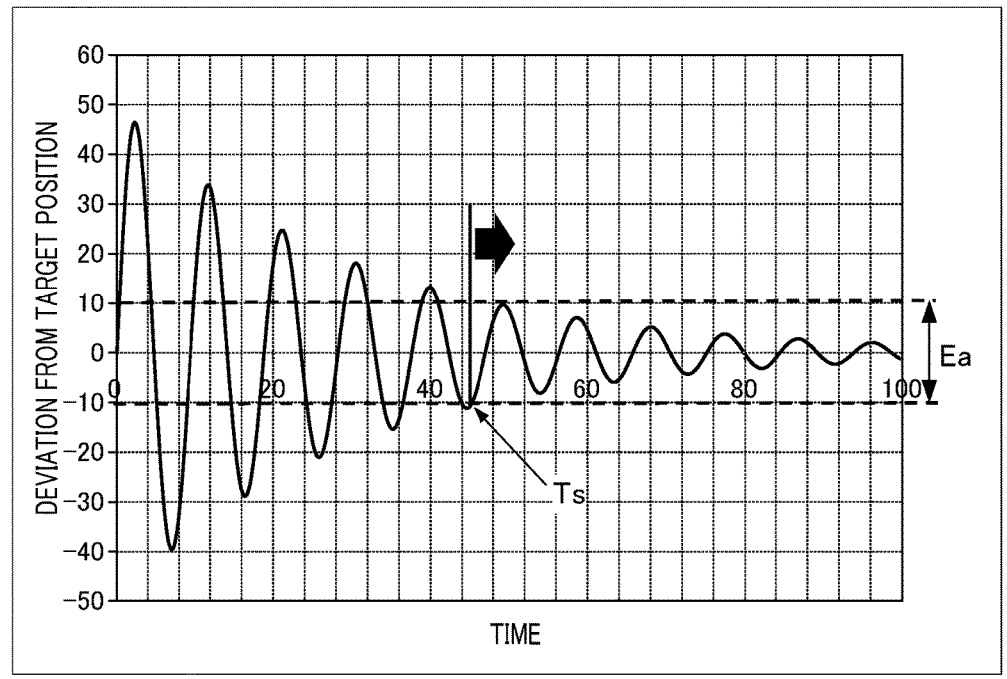
FIG. 7A is a diagram illustrating a temporal change in a deviation of the position of a wafer stage from a target position when a detecting apparatus of the conventional art performs measurement.
Figure 7B:
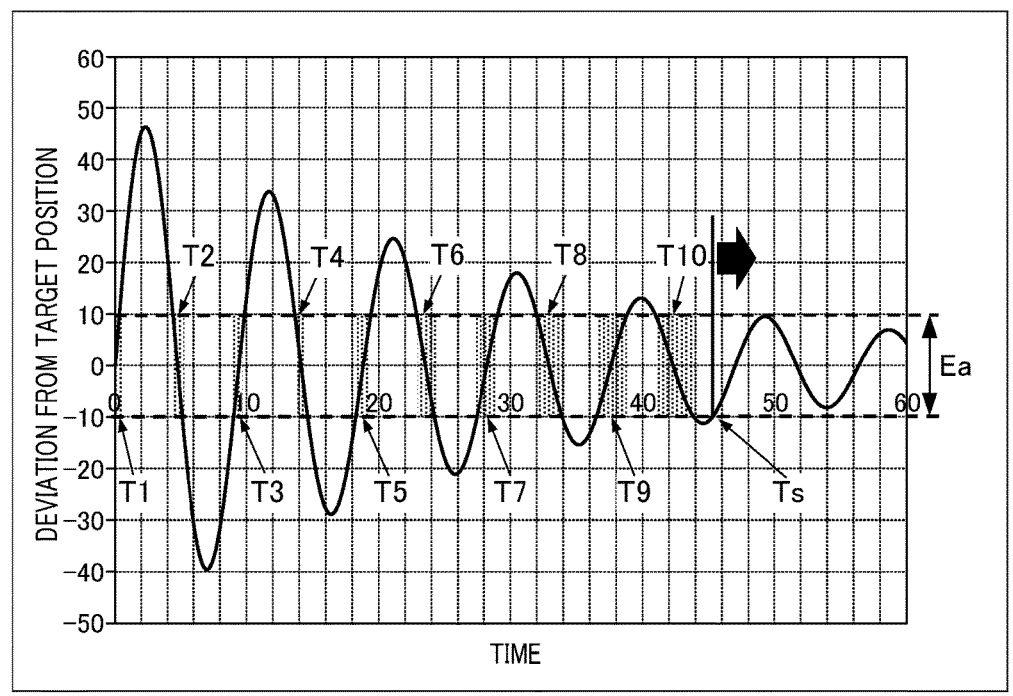
FIG. 7B is a diagram illustrating a temporal change in a deviation of the position of a wafer stage from a target position when the detecting apparatus according to the first embodiment performs measurement.

The detection of the mark by the detecting apparatus according to the embodiment has been described. FIGS. 7A and 7B are diagrams illustrating relations between elapsed time from start of movement of the wafer stage 4 to a target position and a deviation from the target position of the position of the wafer stage 4 when the alignment marks 19 are measured. Ea indicates a tolerance of a deviation centering on a position on which vibration of the wafer stage 4 converges. When this value is set in view of measurement precision or a throughput and the deviation is within the tolerance (when vibration of the stage is still), it is possible to measure the marks. A time point at which the deviation is within the tolerance Ea is set as a time Ts. The times Ts in FIGS. 7A and 7B are the same time. In FIG. 7B, times T1 to T10 indicated by shades represent accumulation times. The controller 20 calculates the deviation in real time based on signals from the laser interferometers 10 and 12 measuring positional information of the wafer stage 4.

FIG. 7A illustrates a detecting method of the conventional art. Stillness (stabilization) of vibration of the wafer stage 4 is awaited until the time Ts, and then measurement is started. Depending on measurement precision, the tolerance Ea may be narrowed, the time Ts may be delayed, and thus there is a disadvantage in terms of the throughput. On the other hand, in FIG. 7B, the alignment marks 19 are measured in sections (the times T1 to T10) in which the deviation is within the tolerance Ea from start of movement of the wafer stage 4 to the target position. The controller 20 controls the wafer alignment detecting system 16 such that the times T1 to T10 (periods in which the wafer stage 4 is within the tolerance E) are set as an imaging period.

Here, to improve measurement precision, it is necessary to synchronize the measurement of the alignment marks 19 by the wafer alignment detecting system 16 with the measurement of the wafer stage 4 by the laser interferometer 10. As a synchronizing method, for example, there is a method of synchronizing a timing of pulse lighting with a timing at which the laser interferometer 10 outputs the measurement result using an LED or the like (not illustrated) as a light source of the wafer alignment detecting system 16. The pulse lighting can also be performed by adjusting a light path along which light is guided to the wafer alignment detecting system 16. In addition, there is a method of configuring an electronic shutter in the photoelectric conversion element (imaging element) of the wafer alignment detecting system 16 and synchronizing a timing at which the laser interferometer 10 outputs the measurement result with driving of the electronic shutter. The synchronization is controlled by the controller 20.

The measurement may not necessarily be performed in all the times T1 to T10. The measurement may not be performed in some of the times T1 to T10 when the signal intensity at the peak of the mark waveform can be recognized as in FIG. 4. Times such as some of the times T1 and T3 at which the measurement is performed can be appropriately decided. Even when the measurement is performed in all the times T1 to T10, the measurement may be performed after the time Ts in a case in which the signal intensity at the peak of the mark waveform is deficient. That is, when the intensity of a signal obtained through imaging satisfies an allowable condition, the controller 20 controls the wafer alignment detecting system 16 such that the imaging is ended. The length (the allowable condition) of a necessary accumulation time can be decided in accordance with physical characteristics or optical characteristics of the marks. The controller 20 obtains the positions of the alignment marks 19 based on an output of the wafer alignment detecting system 16 and an output of the laser interferometer 10.

In this way, the detecting apparatus according to the embodiment can perform the measurement without awaiting the stillness of the vibration of the wafer stage 4 and degrading the detection precision of the marks. According to the embodiment, it is possible to provide the detecting apparatus that is useful in advancing detection completion of the marks.

Second Embodiment

Figure 8:
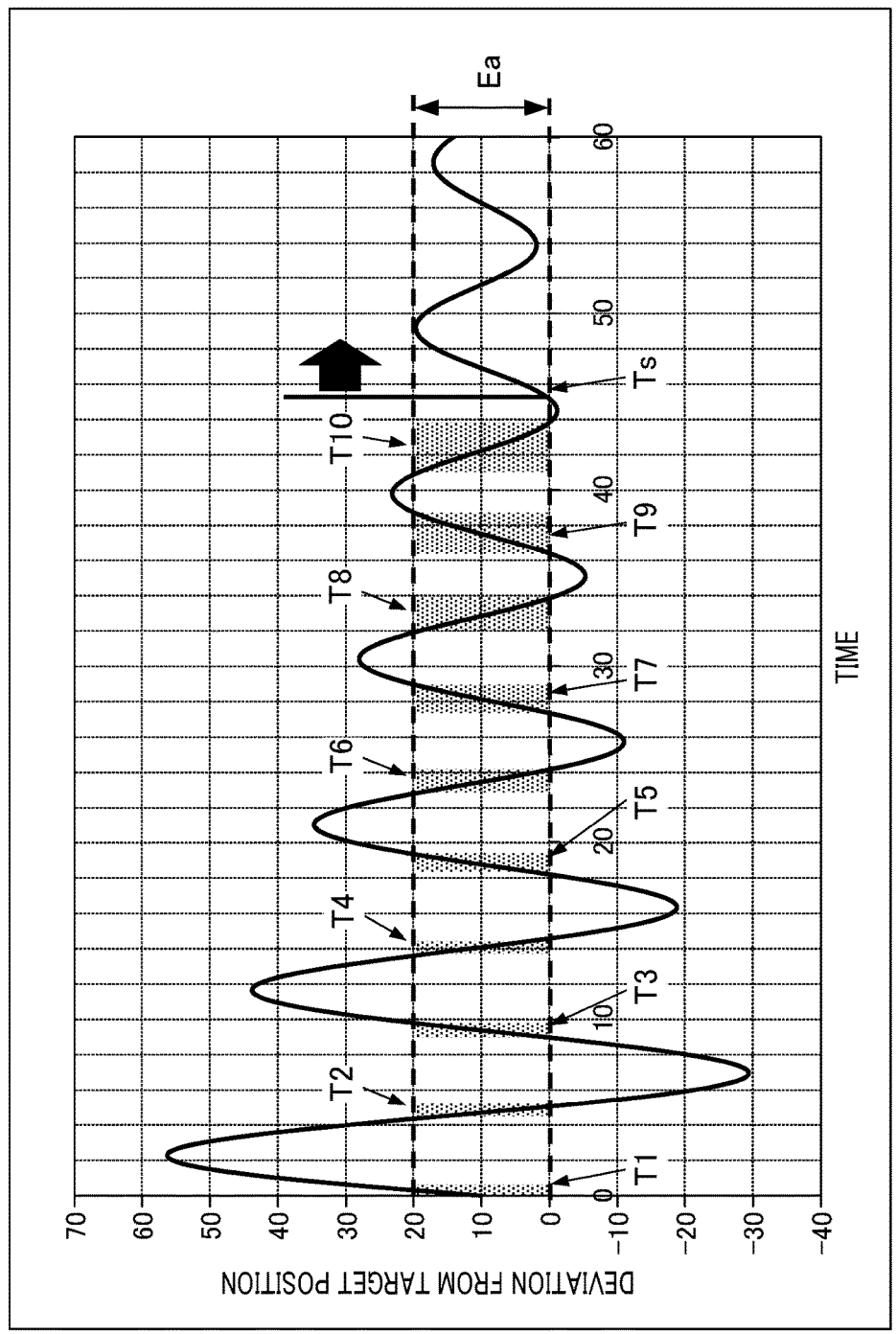
FIG. 8 is a diagram illustrating a temporal change in a deviation of the position of a wafer stage from a target position according to a second embodiment.

In the first embodiment, the position of the wafer stage 4 is assumed to converge on the target position (deviation zero). However, depending on a state of the apparatus, a measurement condition, or the like, the position of the wafer stage 4 converges on a position at which there is a deviation to some extent in some cases. FIG. 8 is a diagram illustrating a temporal change in a deviation of the position of the wafer stage from the target position according to the embodiment. FIG. 8 illustrates a case in which the position on which the stage position converges is changed from deviation zero to deviation 10 with respect to the case of FIG. 7B. The accumulation times and the like are the same as those of the first embodiment except that the falling position is different. The falling position can be set based on vibration characteristics of the wafer stage 4 which are obtained in advance. Several points can be measured, a tendency of the deviation can be monitored, and the falling position can be set from a monitoring result. According to the embodiment, it is possible to deal with a case in which the vibration of the stage converges on a position deviated from the target position. The detecting apparatus according to the embodiment can obtain the same advantages as that of the first embodiment.

Third Embodiment

Figure 9A:
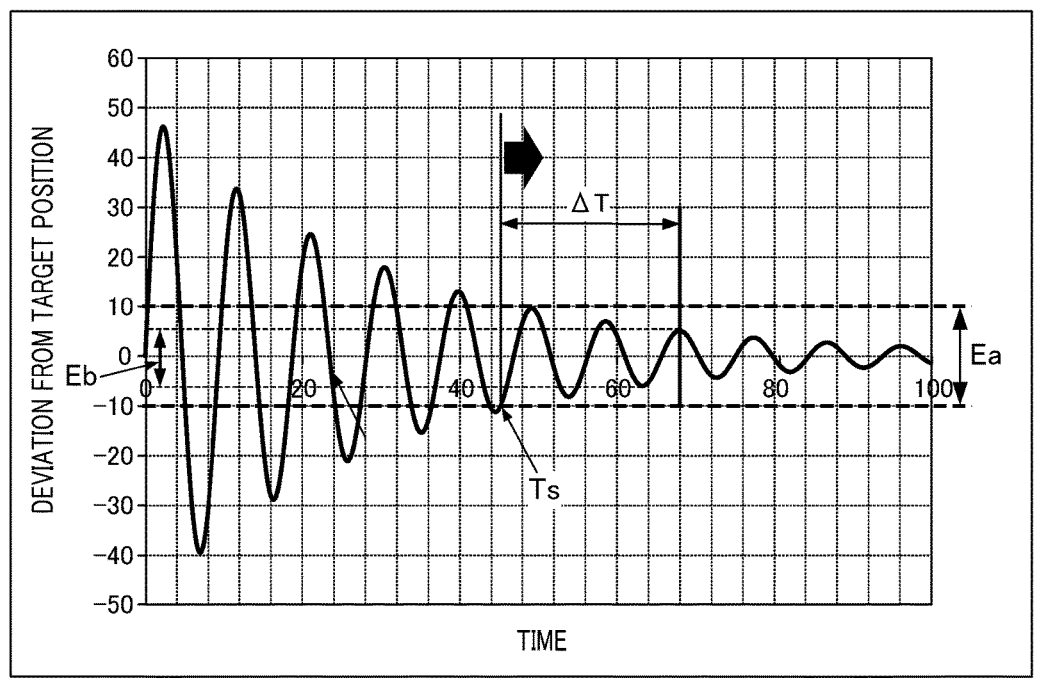
FIG. 9A is a diagram illustrating a temporal change in a deviation of the position of a wafer stage from a target position when a detecting apparatus of the conventional art performs measurement.
Figure 9B:
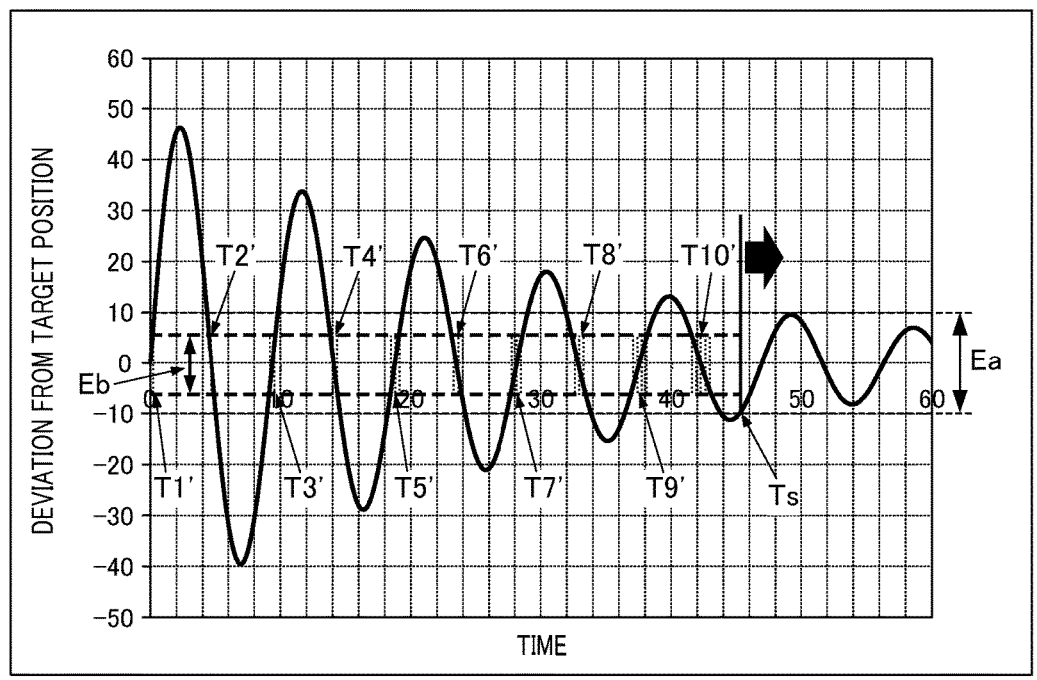
FIG. 9B is a diagram illustrating a temporal change in a deviation of the position of a wafer stage from a target position when a detecting apparatus according to a third embodiment performs measurement.

FIGS. 9A and 9B are diagrams illustrating relations between elapsed time from start of movement of the wafer stage 4 to a target position and a deviation from the target position of the position of the wafer stage 4 when the alignment marks 19 are measured. In the embodiment, the tolerance Eb in which a tolerance is narrower than Ea according to the foregoing embodiments is used. FIG. 9A illustrates a detecting method of the conventional art and a case in which measurement is performed for an accumulation time of ΔT from the time Ts. The tolerance according to the embodiment is set to a minimum value of the amplitude of vibration in a section of ΔT in FIG. 9A. An accumulation time corresponding to the tolerance Eb is T1' to T10' illustrated in FIG. 9B.

As the tolerance is narrower, a difference in the deviation of the stage within an accumulation time is smaller and the peaks of the mark waveforms are more easily uniform at the same position on the sensor. Accordingly, as the signal intensity at the peak of the obtained mark waveform is stronger and the tolerance is narrower, mark detection precision becomes better. The marks can be detected with rough precision and then subsequently be detected finely. By changing the tolerance, it is possible to deal with the detection. According to the embodiment, by narrowing the tolerance, it is possible to improve the detection precision. Thus, the detecting apparatus according to the embodiment can also obtain the same advantages as those of the foregoing embodiments.

In the foregoing embodiments, the mark detection has been described as an example to perform the position measurement in the X direction. However, mark detection can also be performed simultaneously for position measurement in the Y direction. In the foregoing embodiments, the measurement of the alignment marks 19 by the wafer alignment detecting system 16 has been described as an example. However, the invention can also be applied to measurement of the reference marks by the reticle alignment detecting system 13. The positions of the marks can be obtained based on a representative value of the position of the stage during a period in which the position of the stage is within the tolerance. The representative value may be one of statistical values such as an average value, a median value, and a norm of the positions. An object which is a position measurement target is not limited to the wafer stage 4, but may be the reticle stage 2.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern on a substrate using the aforementioned lithography apparatus; and a step of processing (for example, removing a remaining film (when the lithography apparatus is an imprint apparatus)) the substrate on which the pattern has been formed in the previous step. When the lithography apparatus is an exposure or drawing apparatus, a developing step is included instead of the processing step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-084599 filed on Apr. 20, 2016, which are hereby incorporated by reference herein in its entirety.

What is claimed is:

1. A detecting apparatus for detecting a mark on an object, the apparatus comprising:
    an imaging device including an image sensor and configured to perform imaging of the mark on the object; and
    a controller including a computer and configured to:
        obtain a deviation between a current position of a stage that supports and positions the object and a target position thereof at which the stage undergoing a periodic vibration is positioned within a predetermined tolerance from a center of the periodic vibration; and
        control the imaging device to perform the imaging of the mark on the object while the current position of the stage undergoing the periodic vibration is within the target position, before a peak level of the obtained deviation becomes equal to or less than the predetermined tolerance.

2. The detecting apparatus according to claim 1, wherein the controller is configured to obtain the period of the imaging based on an output from a measuring device configured to measure the position of the stage.

3. The detecting apparatus according to claim 2, wherein the controller is configured to obtain a position of the mark based on an output of the imaging device and an output of the measuring device.

4. The detecting apparatus according to claim 3, wherein the controller is configured to obtain the position of the mark based on a representative value of the position of the object in a period where the position of the stage is within the target position.

5. The detecting apparatus according to claim 1, wherein the controller is configured to control the imaging device to perform the imaging during a plurality of discontinuous periods where the current position of the stage undergoing the periodic vibration is within the target position, before the obtained deviation becomes equal to or less than the predetermined tolerance.

6. The detecting apparatus according to claim 1, wherein the controller is configured to control the imaging device to end the imaging in a case where an intensity of a signal obtained by the imaging satisfies a predetermined tolerable condition.

7. The detecting apparatus according to claim 1, wherein the controller is configured to control an electronic shutter of the image sensor included in the imaging device or a light source, for illuminating the mark, included in the imaging device to perform the imaging.

8. A detecting method of detecting a mark on an object, the method comprising the steps of:
    obtaining a deviation between a current position of a stage that supports and positions the object and a target position thereof at which the stage undergoing a periodic vibration is positioned within a predetermined tolerance from a center of the periodic vibration; and
    performing imaging of the mark on the object while the current position of the stage undergoing the periodic vibration is within the target position, before a peak level of the obtained deviation becomes equal to or less than the predetermined tolerance.

9. A lithography apparatus for forming a pattern on a substrate, the lithography apparatus comprising:
    a stage configured to support and position a substrate; and
    a detecting apparatus configured to detect a mark on the substrate and including:
        an imaging device including an image sensor and configured to perform imaging of the mark on the substrate; and
        a controller including a computer and configured to:
            obtain a deviation between a current position of the stage and a target position thereof at which the stage undergoing a periodic vibration is positioned within a predetermined tolerance from a center of the periodic vibration; and
            control the imaging device to perform the imaging of the mark on the substrate while the current position of the stage undergoing the periodic vibration is within the target position, before a peak level of the obtained deviation becomes equal to or less than the predetermined tolerance.

10. A method of manufacturing an article, the method comprising steps of:
    forming a pattern on a substrate using a lithography apparatus; and
    processing the substrate, on which the pattern has been formed, to manufacture the article,
    wherein the lithography apparatus includes:
        a stage configured to support and position the substrate; and
        a detecting apparatus configured to detect a mark on the substrate and including:
            an imaging device including an image sensor and configured to perform imaging of the mark on the substrate; and
            a controller including a computer and configured to:
                obtain a deviation between a current position of the stage and a target position thereof at which the stage undergoing a periodic vibration is positioned within a predetermined tolerance from a center of the periodic vibration; and
                control the imaging device to perform the imaging of the mark on the substrate while the current position of the stage undergoing the periodic vibration is within the target position, before a peak level of the obtained deviation becomes equal to or less than the predetermined tolerance.

11. A detecting apparatus for detecting a mark on a stage that supports and positions an object, the apparatus comprising:
    an imaging device including an image sensor and configured to perform imaging of the mark on the stage; and
    a controller including a computer and configured to:
        obtain a deviation between a current position of the stage and a target position thereof at which the stage undergoing a periodic vibration is positioned within a predetermined tolerance from a center of the periodic vibration; and
        control the imaging device to perform the imaging of the mark on the stage while the current position of the stage undergoing the periodic vibration is within the target position, before a peak level of the obtained deviation becomes equal to or less than the predetermined tolerance.

12. A detecting method of detecting a mark on a stage that supports and positions an object, the method comprising the steps of:
    obtaining a deviation between a current position of the stage and a target position thereof at which the stage undergoing a periodic vibration is positioned within a predetermined tolerance from a center of the periodic vibration; and
    performing imaging of the mark on the stage while the current position of the stage undergoing the periodic vibration is within the target position, before a peak level of the obtained deviation becomes equal to or less than the predetermined tolerance.

13. A lithography apparatus for forming a pattern on a substrate, the apparatus comprising:
    a stage configured to support and position a substrate; and
    a detecting apparatus configured to detect a mark on the stage and including:
        an imaging device including an image sensor and configured to perform imaging of the mark on the stage; and
        a controller including a computer and configured to:
            obtain a deviation between a current position of the stage and a target position thereof at which the stage undergoing a periodic vibration is positioned within a predetermined tolerance of the periodic vibration; and
            control the imaging device to perform the imaging of the mark on the stage while the current position of the stage undergoing the periodic vibration is within the target position, before a peak level of the obtained deviation becomes equal to or less than the predetermined tolerance.

14. A method of manufacturing an article, the method comprising steps of:
    forming a pattern on a substrate using a lithography apparatus; and
    processing the substrate, on which the pattern has been formed, to manufacture the article,
    wherein the lithography apparatus includes:

a stage configured to support and position the substrate; and a detecting apparatus configured to detect a mark on the stage and including:
an imaging device including an image sensor and configured to perform imaging of the mark on the stage; and
a controller including a computer and configured to:
obtain a deviation between a current position of the stage and a target position thereof at which the stage undergoing a periodic vibration is positioned within a predetermined tolerance from a center of the periodic vibration; and
control the imaging device to perform the imaging of the mark on the stage while the current position of the stage undergoing the periodic vibration is within the target position, before a peak level of the obtained deviation becomes equal to or less than the predetermined tolerance.

15. A lithography apparatus for forming a pattern on a substrate, the apparatus comprising:
a detecting apparatus configured to detect a mark on the object by imaging the mark; and
a stage configured to support, move, and position an object, wherein vibration is induced to the stage while the stage is being moved, and wherein a peak level of the vibration of the stage is larger than a predetermined tolerance value from a center of a periodic vibration while imaging the mark;
wherein the detecting apparatus includes:
an imaging device including an image sensor and configured to perform imaging of the mark on the object to detect whether the mark on the object is in a predetermined position; and
a controller including a computer and configured to:
detect a deviation between a current position of the stage and a target position thereof at which the stage undergoing the periodic vibration is positioned within the predetermined tolerance value from the center of the periodic vibration; and
control the imaging device to intermittently image the mark on the object while the current position of the stage undergoing the periodic vibration is within the target position, although the peak level of the vibration is larger than the predetermined tolerance value.

16. A lithography apparatus for forming a pattern on a substrate, the apparatus comprising:
a detecting apparatus configured to detect a mark on the stage by imaging the mark; and
a stage configured to support and position an object, and move to a target position, wherein a vibration is induced to the stage while the stage is being moved to the target position, and wherein a peak level of the vibration of the stage is larger than a predetermined tolerance value at a time when the stage reaches the target position;
a stage configured to support, move, and position an object, wherein vibration is induced to the stage while the stage is being moved, and wherein a peak level of the vibration of the stage is larger than a predetermined tolerance value from a center of a periodic vibration while imaging the mark;
wherein the detecting apparatus includes:
an imaging device including an image sensor and configured to perform imaging of the mark on the stage to detect whether the mark on the stage is in a predetermined position; and
a controller including a computer and configured to:
detect a deviation between a current position of the stage and a target position thereof at which the stage undergoing the periodic vibration is positioned within the predetermined tolerance value from the center of the periodic vibration; and
control the imaging device to intermittently image the mark on the stage while the current position of the stage undergoing the periodic vibration is within the target position, although the peak level of the vibration is larger than the predetermined tolerance value.

\* \* \* \* \*